(12) United States Patent
Schulze et al.

(10) Patent No.: US 9,142,401 B2
(45) Date of Patent: Sep. 22, 2015

(54) SEMICONDUCTOR DEVICE AND METHOD OF MANUFACTURING A SEMICONDUCTOR DEVICE WITH A CONTINUOUS SILICATE GLASS STRUCTURE

(71) Applicant: Infineon Technologies AG, Neubiberg (DE)

(72) Inventors: Hans-Joachim Schulze, Taufkirchen (DE); Alexander Susiti, Stadelbach (AT); Markus Zundel, Egmating (DE); Reinhard Ploss, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/305,359

(22) Filed: Jun. 16, 2014

(65) Prior Publication Data

US 2014/0291816 A1   Oct. 2, 2014

Related U.S. Application Data

(62) Division of application No. 13/473,231, filed on May 16, 2012, now Pat. No. 8,785,997.

(51) Int. Cl.
*H01L 27/108* (2006.01)
*H01L 21/02* (2006.01)
(Continued)

(52) U.S. Cl.
CPC .... *H01L 21/02123* (2013.01); *H01L 21/02129* (2013.01); *H01L 21/02321* (2013.01); *H01L 21/3115* (2013.01); *H01L 23/291* (2013.01);
(Continued)

(58) Field of Classification Search
CPC ........................................................ H01L 29/00
USPC .................. 257/330, 295, E21.651, E27.091, 257/E29.027, E29.066; 438/270
See application file for complete search history.

(56) References Cited

U.S. PATENT DOCUMENTS 5,316,959 A   5/1994 Kwan et al.
5,639,676 A   6/1997 Hshieh et al.
(Continued)

FOREIGN PATENT DOCUMENTS

CN   1638131 A    7/2005
CN   101452880 A  6/2009
(Continued)

OTHER PUBLICATIONS

Kroener, F. et al., F. Kroener, et al. "Phosphorous Ion Shower Implantation for Special Poer IC Applications." International Conference on Ion Implantation Technology. IEEE, 2000. pp. 476-479. Austria.
(Continued)

*Primary Examiner* — Telly Green
(74) *Attorney, Agent, or Firm* — Murphy, Bilak & Homiller, PLLC (57) ABSTRACT

A method of manufacturing a semiconductor device includes forming a continuous silicate glass structure over a first surface of a semiconductor body, including a first part of the continuous glass structure over an active area of the semiconductor body and a second part of the continuous glass structure over an area of the semiconductor body outside of the active area. A first composition of dopants included in the first part of continuous glass structure differs from a second composition of dopants of the second part of the continuous glass structure.

8 Claims, 7 Drawing Sheets

(51) Int. Cl.
  *H01L 23/29* (2006.01)
  *H01L 23/31* (2006.01)
  *H01L 29/10* (2006.01)
  *H01L 29/78* (2006.01)
  *H01L 29/49* (2006.01)
  *H01L 29/66* (2006.01)
  *H01L 29/739* (2006.01)
  *H01L 21/3115* (2006.01)
  H01L 29/06 (2006.01)
  H01L 29/423 (2006.01)
  H01L 29/40 (2006.01)

(52) U.S. Cl.
  CPC ............ *H01L 23/3171* (2013.01); *H01L 29/06* (2013.01); *H01L 29/1095* (2013.01); *H01L 29/4916* (2013.01); *H01L 29/66348* (2013.01); *H01L 29/66734* (2013.01); *H01L 29/7397* (2013.01); *H01L 29/7802* (2013.01); *H01L 29/7809* (2013.01); *H01L 29/7811* (2013.01); *H01L 29/7813* (2013.01); H01L 29/0696 (2013.01); H01L 29/407 (2013.01); H01L 29/4236 (2013.01); H01L 2924/0002 (2013.01)

(56) References Cited

U.S. PATENT DOCUMENTS

| | | |
|---|---|---|
| 5,981,380 A | 11/1999 | Trivedi et al. |
| 6,081,476 A | 6/2000 | Hotta |
| 6,472,750 B1 | 10/2002 | Sonego et al. |
| 6,627,467 B2 | 9/2003 | Haluzak et al. |
| 6,821,855 B2 | 11/2004 | Juengling et al. |
| 7,045,857 B2 | 5/2006 | Darwish et al. |
| 7,148,547 B2 | 12/2006 | Rudeck |
| 7,288,817 B2 | 10/2007 | Juengling et al. |
| 7,294,567 B2 | 11/2007 | Rudeck |
| 7,304,387 B2 | 12/2007 | Chang et al. |
| 7,601,598 B2 | 10/2009 | Juengling et al. |
| 7,667,242 B1 | 2/2010 | Veliadis et al. |
| 7,700,466 B2 | 4/2010 | Booth, Jr. et al. |
| 7,932,557 B2 | 4/2011 | Rudeck |
| 8,058,185 B2 | 11/2011 | Chang et al. |
| 8,120,129 B2 | 2/2012 | Park |
| 8,289,761 B2 | 10/2012 | Park et al. |
| 8,498,147 B2 | 7/2013 | Park et al. |
| 2002/0140027 A1 | 10/2002 | Mo et al. |
| 2003/0036264 A1 | 2/2003 | Ying et al. |
| 2003/0082841 A1 | 5/2003 | Haluzak et al. |
| 2003/0170954 A1 | 9/2003 | Rudeck |
| 2004/0043573 A1 | 3/2004 | Juengling et al. |
| 2004/0075150 A1 | 4/2004 | Juengling et al. |
| 2005/0026350 A1 | 2/2005 | Rudeck |
| 2005/0124106 A1 | 6/2005 | Juengling et al. |
| 2006/0237800 A1 | 10/2006 | Rudeck |
| 2006/0278949 A1 | 12/2006 | Chang et al. |
| 2006/0284219 A1 | 12/2006 | Chang et al. |
| 2007/0155104 A1 | 7/2007 | Marchant et al. |
| 2008/0038893 A1 | 2/2008 | Juengling et al. |
| 2008/0057689 A1 | 3/2008 | Chang et al. |
| 2009/0008698 A1 | 1/2009 | Lee et al. |
| 2009/0026491 A1 | 1/2009 | Booth, Jr. et al. |
| 2010/0072568 A1 | 3/2010 | Park |
| 2010/0264487 A1 | 10/2010 | Mo et al. |
| 2010/0296338 A1 | 11/2010 | Park et al. |
| 2012/0032269 A1 | 2/2012 | Chang et al. |
| 2012/0091523 A1 | 4/2012 | Ji et al. |
| 2013/0037874 A1 | 2/2013 | Park et al. |
| 2013/0039123 A1 | 2/2013 | Park et al. |
| 2013/0043456 A1 | 2/2013 | Park et al. |

FOREIGN PATENT DOCUMENTS

| | | |
|---|---|---|
| CN | 101926003 A | 12/2010 |
| WO | 9630947 | 10/1996 |

OTHER PUBLICATIONS

Ryssel, H. et al., H. Ryssel, et al. "Large Area Ion Implantation at Low Energies." The Fifteenth International Conference on the Application of Accelerators in Research and Industry. AIP Conference Proceedings, 1999, vol. 475, pp. 789-791.

S100 forming a continuous silicate glass structure over a first surface of a semiconductor body including a first part of the continuous glass structure over an active area of the semiconductor body and a second part of the continuous glass structure over an area outside of the active area, wherein a first composition of dopants included in the first part of continuous glass structure differs from a second composition of dopants in the second part of the continuous glass structure

FIG 8

S200 forming a continuous silicate glass structure over a first surface of a semiconductor body

S210 forming a concentration of at least one of phosphor and boron in at least a part of the continuous glass structure that decreases by at least a factor of two between a first side and a second side of the continuous glass structure, wherein the second side is closer to the first surface of the semiconductor body than the first side

SEMICONDUCTOR DEVICE AND METHOD OF MANUFACTURING A SEMICONDUCTOR DEVICE WITH A CONTINUOUS SILICATE GLASS STRUCTURE

PRIORITY CLAIM

This application is a divisional of U.S. patent application Ser. No. 13/473,231 filed on 16 May 2012, said application incorporated herein by reference in its entirety.

BACKGROUND

Edge termination areas of semiconductor devices, e.g. power semiconductor devices having blocking voltage capabilities of several hundreds or thousands of volts, are sensitive to charges accumulated in dielectrics covering surfaces. Both positive and negative charges may affect the blocking voltage capabilities of semiconductor devices, e.g. Insulated Gate Bipolar Transistors (IGBTs), FETs (Field Effect Transistors) or diodes, adversely. Since charges accumulated in dielectrics may be displaced by electrical fields, this may lead to instabilities during operation of the semiconductor devices. Any kind of junction terminations, e.g. field rind structures, Variation of Lateral Doping (VLD) edge termination structures or Junction Termination Extension (JTE) edge termination structures may be affected adversely and deteriorate a reliability of the semiconductor device. In the edge termination area a considerable amount of undesired charges may accumulate since the edge termination area may contribute to a substantial part an overall chip area. As an example, positive charges in oxides may be due to presence of alkaline metals, e.g. sodium (Na) and/or potassium (K), and negative charges may due to presence of impurities, e.g. $OH^-$.

It is desirable to improve the reliability of semiconductor devices and to provide a method of manufacturing a semiconductor device.

SUMMARY

According to an embodiment of a semiconductor device, the semiconductor device includes a semiconductor body including a first surface. The semiconductor device further includes a continuous silicate glass structure over the first surface. A first part of the continuous glass structure over an active area of the semiconductor body includes a first composition of dopants that differs from a second composition of dopants in a second part of the continuous glass structure over an area of the semiconductor body outside of the active area.

According to another embodiment of a semiconductor device, the semiconductor device includes a semiconductor body including a first surface. The semiconductor device further includes a continuous silicate glass structure over the first surface. At least a part of the continuous glass structure includes a concentration of at least one of phosphor and boron that decreases by at least a factor of two between a first side and a second side of the continuous glass structure, wherein the second side is closer to the first surface of the semiconductor body than the first side.

According to another embodiment of a semiconductor device, the semiconductor device includes a semiconductor body including a first surface. The semiconductor device further includes a continuous silicate glass layer stack over the first surface. The silicate glass layer stack includes at least one BPSG layer and one PSG layer.

According to an embodiment of a method of manufacturing a semiconductor device, the method includes forming a continuous silicate glass structure over a first surface of a semiconductor body including a first part of the continuous glass structure over an active area of the semiconductor body and a second part of the continuous glass structure over an area of the semiconductor body outside of the active area. A first composition of dopants included in the first part of continuous glass structure differs from a second composition of dopants in the second part of the continuous glass structure.

According to another embodiment of a method of manufacturing a semiconductor device, the method includes forming a continuous silicate glass structure over a first surface of a semiconductor body. The method further includes forming a concentration of at least one of phosphor and boron in at least a part of the continuous glass structure that decreases by at least a factor of two between a first side and a second side of the continuous glass structure. The second side is closer to the first surface of the semiconductor body than the first side.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description serve to explain principles of the invention. Other embodiments of the invention and many of the intended advantages will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described as part of one embodiment can be used in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes are designated by the same references in the different drawings if not stated otherwise.

As employed in the specification, the term "electrically coupled" is not meant to mean that the elements must be directly coupled together. Instead, intervening elements may be provided between the "electrically coupled" elements. As an example, none, part, or all of the intervening element(s) may be controllable to provide a low-ohmic connection and, at another time, a non-low-ohmic connection between the "electrically coupled" elements. The term "electrically connected" intends to describe a low-ohmic electric connection between the elements electrically connected together, e.g., a connection via a metal and/or highly doped semiconductor.

Some Figures refer to relative doping concentrations by indicating "−" or "+" next to the doping type. For example, "n−" means a doping concentration which is less than the doping concentration of an "n"-doping region while an "n+"-doping region has a larger doping concentration than the "n"-doping region. Doping regions of the same relative doping concentration may or may not have the same absolute doping concentration. For example, two different n+-doped regions can have different absolute doping concentrations. The same applies, for example, to an n−-doped and a p+-doped region. In the embodiments described below, a conductivity type of the illustrated semiconductor regions is denoted n-type or p-type, in more detail one of n−-type, n-type, n+-type, p−-type, p-type and p+-type. In each of the illustrated embodiments, the conductivity type of the illustrated semiconductor regions may be vice versa. In other words, in an alternative embodiment to any one of the embodiments described below, an illustrated p-type region may be n-type and an illustrated n-type region may be p-type.

Figure 1:
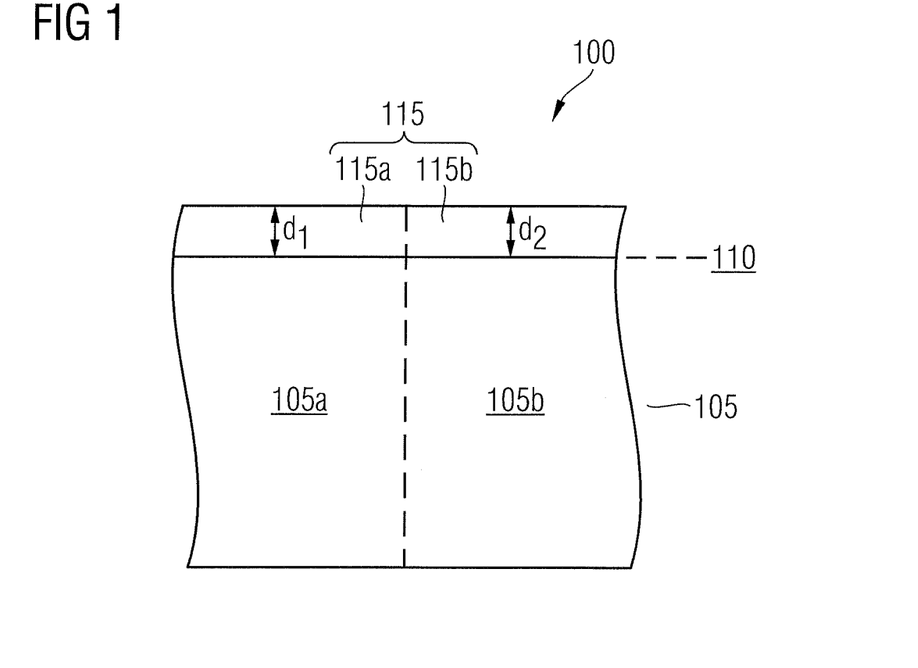
FIG. 1 illustrates a cross-sectional view of one embodiment of a semiconductor device including a silicate glass structure having different compositions of dopants in a first area and in a second area.

FIG. 1 illustrates a cross-sectional view of a semiconductor device 100 according to an embodiment. The semiconductor device 100 includes a semiconductor body 105 having a first surface 110. A continuous silicate glass structure 115 is formed over the first surface 110. A first part 115a of the continuous glass structure 115 over an active area 105a of the semiconductor body 105 includes a first composition of dopants that differs from a second composition of dopants in a second part 115b of the continuous glass structure 115 over an area 105b of the semiconductor body 105 outside of the active area 105a.

The semiconductor device 100 may be any semiconductor device including IGBT, FET, e.g. Metal Oxide Semiconductor FET (MOSFET) and diode. According to one embodiment, the semiconductor device 100 is a power semiconductor device operating on similar principles to its low-power counterpart, but being able to carry a larger amount of current and typically also supporting a larger reverse-bias voltage in the off-state. As an example the semiconductor device 100 is a power semiconductor device configured to block reverse-bias voltages exceeding 30 V and/or switching currents exceeding 1 A.

The semiconductor body 105 may include a semiconductor substrate, e.g. a silicon substrate, a compound semiconductor substrate, a silicon on insulator (SOI) substrate, including none, one or a plurality of semiconductor layers, e.g. epitaxial semiconductor layers, formed thereon.

In the active area 105a of the semiconductor device 100, device elements are present that are absent in the area 105b surrounding the active area 105a. As an example, the area 105b surrounding the active area 105a may include an edge termination area including one or more of field ring structures, VLD edge termination structures and JTE edge termination structures. Device elements present in the active area 105a and absent in the area 105b surrounding the active area 105a may include gate electrode and/or source and/or body of IGBTs and FETs and anode emitter or cathode emitter of a diode.

According to one embodiment, the silicate glass structure 115 adjoins the semiconductor body 105 at the surface 110 in the area 105b. In other words, the silicate glass structure 115 is in contact with the semiconductor body 105 in the area 105b. The silicate glass structure 115 may include through hole portions, e.g. in the active area 105a and/or the area 105b that may include contact structures configured to electrically couple semiconductor regions in the semiconductor body 105 and a wiring arranged above the silicate glass structure 115.

According to one embodiment, a thickness $d_1$ of the silicate glass structure 115 in the first part 115a equals a thickness $d_2$ in the second part 115b. As an example, the different compositions of dopants in the first part 115a and in the second part 115b, i.e. the first and second compositions, may be formed by introducing dopants into one of the first part 115a and the second part 115b by an appropriate method, e.g. by introducing the dopants during epitaxial deposition or by ion implantation including ion shower implantation or plasma deposition for high dose and low energy implants. As a further example, the different compositions of dopants in the first part 115a and in the second part 115b may be formed by introducing different types and/or concentrations of dopants into the first part 115a and the second part 115b by an appropriate method, e.g. ion implantation including ion shower implantation for high dose and low energy implants.

According to another embodiment, a thickness $d_1$ of the silicate glass structure 115 in the first part 115a is larger than a thickness $d_2$ of the second part 115b, i.e. $d_1 > d_2$. As an example, the first part 115a may include a higher number of stacked silicate glass layers than the second part 115b. According to yet another embodiment, a thickness $d_1$ of the silicate glass structure 115 in the first part 115a is smaller than a thickness $d_2$ of the second part 115b, i.e. $d_1 < d_2$. As an example, the first part 115a may include a lower number of stacked silicate glass layers than the second part 115b.

According to one embodiment at least one wiring level including a metal is arranged over the continuous silicate glass structure 115 and a wiring level including a metal is absent between the continuous silicate glass structure 115 and the surface 110 of the semiconductor body 105 in the second area 105b. In the active area 105a, the continuous silicate glass structure 115 may include through holes including contacts.

Formation of different compositions of dopants in the first part 115a and in the second part 115b of the silicate glass structure 115 allows better adjustment of the characteristics of the silicate glass structure 115 to the specific requirements in the first part 115a and in the second part 115b which may differ. As an example, requirements on flow characteristic of the silicate glass structure 115 may be higher in the first part 115a than in the second part 115b due to more pronounced topology within the active cell area than in the edge termination area. This allows focusing on gettering efficiency in the edge termination area and flow characteristic in the active cell area, e.g. by using getter-efficient phosphosilicate glass (PSG) in the edge termination area which usually is the most sensitive area in respect to positive or negative charges due to relatively high electrical fields in this area and borophosphosilicate glass (BPSG) having a beneficial flow characteristic in the active cell area. Since different compositions of dopants in the silicate glass structure 115 allow to improve different characteristics of the silicate glass structure, the reliability of the semiconductor device can be improved by adjusting the compositions of dopants in the silicate glass structure 115 to the specific requirements in the first part 115a and in the second part 115b.

Figure 2:
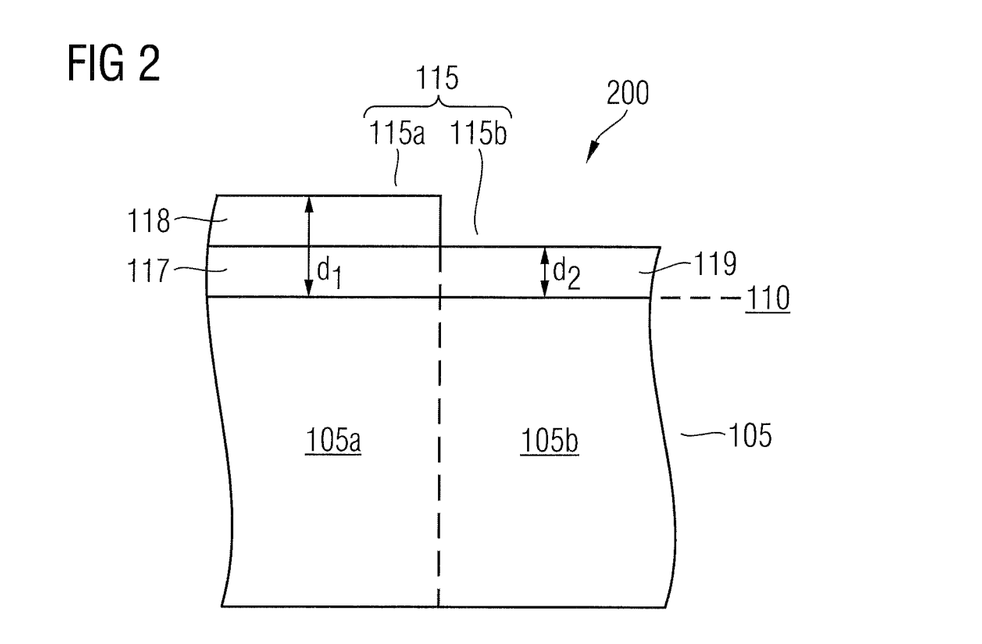
FIG. 2 illustrates a cross-sectional view of one embodiment of a semiconductor device including a silicate glass structure having different compositions of dopants in a first area including a silicate glass layer stack and in a second area.

According to one embodiment of a semiconductor device 200 illustrated in FIG. 2, the first part 115a of the continuous silicate glass structure 115 includes a borophosphosilicate glass (BPSG) layer 117. The first part 115a of the continuous glass structure 115 includes a silicate glass layer stack and the BPSG layer 117 is a lowermost layer of the stack and has a shorter distance to the first surface 110 of the semiconductor body 105 than an uppermost silicate glass layer 118 of the layer stack. Between the BPSG layer 117 and the uppermost silicate glass layer 118, none, one or a plurality of additional silicate glass layers may be formed. The layer stack in the first part 115a of the silicate glass structure 115 includes at least one of a borosilicate glass (BSG) layer and a phosphosilicate glass (PSG) layer over the BPSG layer 117. According to one example, the uppermost layer 118 is the phosphosilicate glass (PSG) layer. According to another embodiment, an optional silicate glass layer sandwiched between the BPSG layer 117 and the uppermost silicate glass layer 118 is the PSG layer. According to another embodiment, an undoped silicate glass (USG) layer may be arranged between the semiconductor body 105 and the BPSG layer 117, e.g. a thin USG layer. Further, an USG layer may be arranged on the uppermost silicate glass layer 118 to avoid or reduce diffusion of dopants out of the silicate glass structure 115 into the semiconductor body 105 and/or ambient. Thereby, an interaction or reaction between the dopant and the ambient, e.g. phosphoric acid, may be prevented or reduced. This allows to use higher P concentrations as usual, e.g. more than 8% or more than 10%. As a further example, the BPSG layer 117 may also be a PSG layer and the PSG layer 118 may be a BPSG layer.

According to one embodiment, a silicate glass layer 119 in the second part 115b of the silicate glass structure 115 is formed together with the uppermost layer 118 in the first part 115a, e.g. by conformal layer deposition after patterning the BPSG layer 117 and optional (additional) undoped or doped silicate glass layers thereon. The silicate glass layers 118, 119 may include a stack of single silicate glass layers or a single PSG layer. According to another embodiment, the silicate glass layers 118 and 119 are subsequently formed, e.g. the silicate glass layer 118 is formed before the silicate glass layer 119. In this case, the silicate glass layer 118 may be patterned together with the BPSG layer 117. According to another example, the silicate glass layer 119 is formed before the silicate glass layer 118. A thickness $d_1$ of the continuous silicate glass structure 115 in the first part 115a is higher than a thickness $d_2$ of the continuous silicate glass structure 115 in the second part 115b.

As used herein, a ratio of percentage by weights between boron and phosphor, i.e. B/P in BPSG is in a range of 30% to 70%. A ratio of percentage by weights between boron and phosphor, i.e. B/P in PSG is in a range of 0% to 10%. A ratio of percentage by weights between boron and phosphor, i.e. B/P in BSG is in a range of 90% to 100%. Further, a concentration of at least one of B and P in BPSG, PSG and BSG includes at least $10^{20}$ cm$^{-3}$, or at least $5 \times 10^{20}$ cm$^{-3}$ or at least $3 \times 10^{21}$ cm$^{-3}$.

Figure 3:
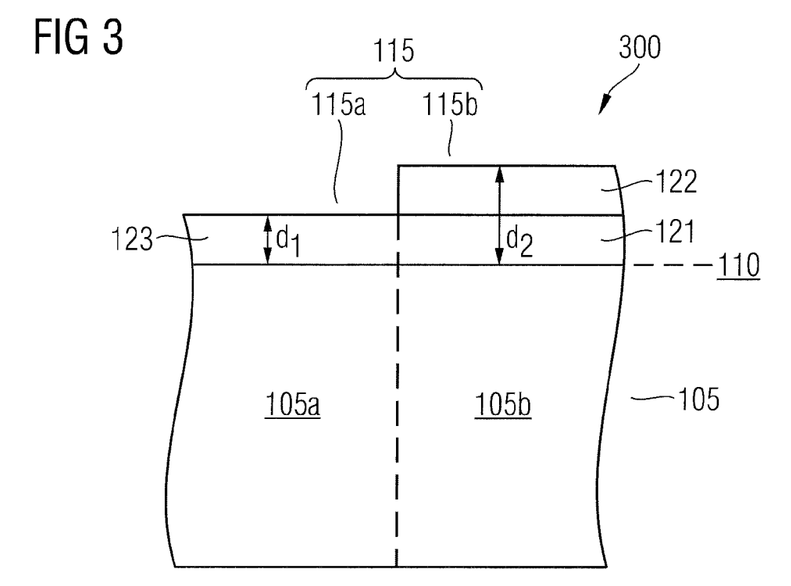
FIGS. 3 and 4A illustrate cross-sectional views of embodiments of a semiconductor device including a silicate glass structure having different compositions of dopants in a first area and in a second area including a silicate glass layer stack.

According to one embodiment of a semiconductor device 300 illustrated in FIG. 3, the second part 115b of the continuous silicate glass structure 115 includes a PSG layer 121. The second part 115b of the continuous glass structure 115 includes a silicate glass layer stack and the PSG layer 121 is a lowermost layer of the stack and has a shorter distance to the first surface 110 of the semiconductor body 105 than an uppermost silicate glass layer 122 of the layer stack. Between the PSG layer 121 and the uppermost silicate glass layer 122, none, one or a plurality of additional silicate glass layers may be formed. The layer stack in the second part 115b includes at least one of a BSG layer and a BPSG layer over the PSG layer 121. According to one example, the uppermost layer 122 is a BSG layer. According to another embodiment, an optional silicate glass layer sandwiched between the PSG layer 121 and the uppermost silicate glass layer 122 is a BPSG layer.

According to one embodiment, a silicate glass layer 123 in the first part 115a of the silicate glass structure 115 is formed together with the uppermost layer 122 in the second part 115b, e.g. by conformal layer deposition after patterning the PSG layer 121 and optional additional silicate glass layers thereon. The silicate glass layers 122, 123 may include a stack of single silicate glass layers. According to another embodiment, the silicate glass layers 122 and 123 are subsequently formed, e.g. the silicate glass layer 122 is formed before the silicate glass layer 123. In this case, the silicate glass layer 122 may be patterned together with the PSG layer 121. According to another example, the silicate glass layer 123 is formed before the silicate glass layer 122. A thickness $d_1$ of the continuous silicate glass structure 115 in the second part 115b is higher than a thickness $d_2$ of the continuous silicate glass structure 115 in the first part 115a. Similar to the embodiment described above, an USG layer may be provided between the semiconductor body 105 and the PSG layer 121 and/or silicate glass layer 123, e.g. a thin USG layer, or on the silicate glass layers 122 and/or 123.

Figure 4A:
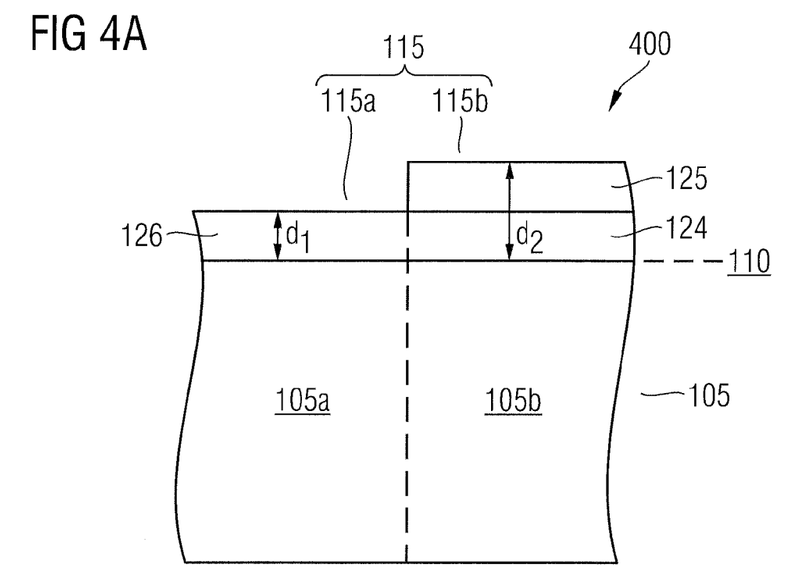

According to one embodiment of a semiconductor device 400 illustrated in FIG. 4A, the second part 115b of the continuous silicate glass structure 115 includes a BSG layer 124. The second part 115b of the continuous glass structure 115 includes a silicate glass layer stack and the BSG layer 124 is a lowermost layer of the stack and has a shorter distance to the first surface 110 of the semiconductor body 105 than an uppermost silicate glass layer 125 of the layer stack. Between the BSG layer 124 and the uppermost silicate glass layer 125, none, one or a plurality of additional silicate glass layers may be formed. The layer stack in the second part 115b includes at least one of a PSG layer and a BPSG layer over the BSG layer 124. According to one example, the uppermost layer 125 is a PSG layer. According to another embodiment, an optional silicate glass layer sandwiched between the BSG layer 124 and the uppermost silicate glass layer 125 is a PSG layer.

According to one embodiment, a silicate glass layer 126 in the first part 115a is formed together with the uppermost layer 125 in the second part 115b, e.g. by conformal layer deposition after patterning the BSG layer 124 and optional additional silicate glass layers thereon. The silicate glass layers 125, 126 may include a stack of single silicate glass layers.

According to another embodiment, the silicate glass layers 125 and 126 are subsequently formed, e.g. the silicate glass layer 125 is formed before the silicate glass layer 126. In this case, the silicate glass layer 125 may be patterned together with the BSG layer 124. According to another example, the silicate glass layer 126 is formed before the silicate glass layer 125. A thickness $d_2$ of the continuous silicate glass structure 115 in the second part 115b is higher than a thickness $d_1$ of the continuous silicate glass structure 115 in the first part 115a. Similar to the embodiment described above, an USG layer may be provided between the semiconductor body 105 and the BSG layer 124 and/or silicate glass layer 126, e.g. a thin USG layer, or on the silicate glass layers 125 and/or 126.

According to one embodiment, the first composition of dopants in the first part 115a of the silicate glass structure 115 that differs from the second composition of dopants in the second part 115b is formed by a high dose and low energy implant, e.g. by a masked ion shower implant or by a masked plasma deposition, in one or a plurality of the silicate glass layers 117 . . . 126 of the embodiments illustrated in FIGS. 2 to 4A or into one part, e.g. the first part 115a or the second part 115b, of the silicate glass structure 115 described in the above embodiment illustrated in FIG. 1. That part of the silicate glass structure 115 that includes dopants introduced by the high dose and low energy implant includes a concentration of at least one of phosphor and boron that decreases by at least a factor of two between a first side and a second side of the continuous glass structure 115, wherein the second side is closer to the first surface 110 of the semiconductor body 105 than the first side. According to an embodiment, a dose of the at least one of phosphor and boron introduced into the silicate glass structure 115 by the high dose and low energy implant is in a range between $5 \times 10^{16}$ cm$^{-2}$ and $5 \times 10^{17}$ cm$^{-2}$. As an example, the second part 115b includes dopants introduced by the high dose and low energy implant so that a concentration of at least one of phosphor and boron decreases by at least a factor of two between a first side and a second side of the continuous glass structure 115.

Figure 4B:
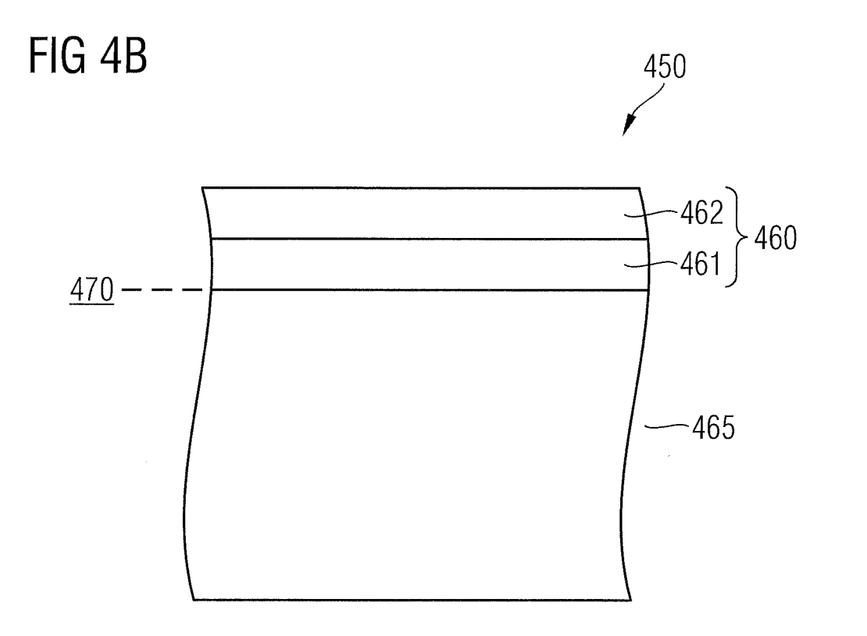
FIG. 4B illustrates a cross-sectional view of another embodiment of a semiconductor device including a silicate glass layer stack.

According to one embodiment of a semiconductor device 450 illustrated in FIG. 4B, a continuous silicate glass layer stack 460 over a surface 470 of a semiconductor body 465 includes a PSG layer 461 and a BPSG layer 462. Formation of the continuous silicate glass layer stack 460 may be carried out without lithography. The continuous silicate glass layer stack 460 may include further silicate glass layers, e.g. optional USG or BSG layers or even further PSG or BPSG layers. These layers may be arranged below, between or above the PSG layer 461 and the BPSG layer 462. The arrangement of the PSG layer 461 and the BPSG layer 462 may also be opposite to the illustration of FIG. 4B, i.e. the PSG layer 461 may be arranged over the BPSG layer 462. As an example, the continuous silicate layer stack 460 may include a sequence of an optional USG layer, a PSG layer, an optional BSG layer and a BPSG layer. The doping of these layers can be realized by introducing the dopants during the deposition of these layers or by implants or plasma deposition steps performed after the deposition of each layer.

Figure 5:
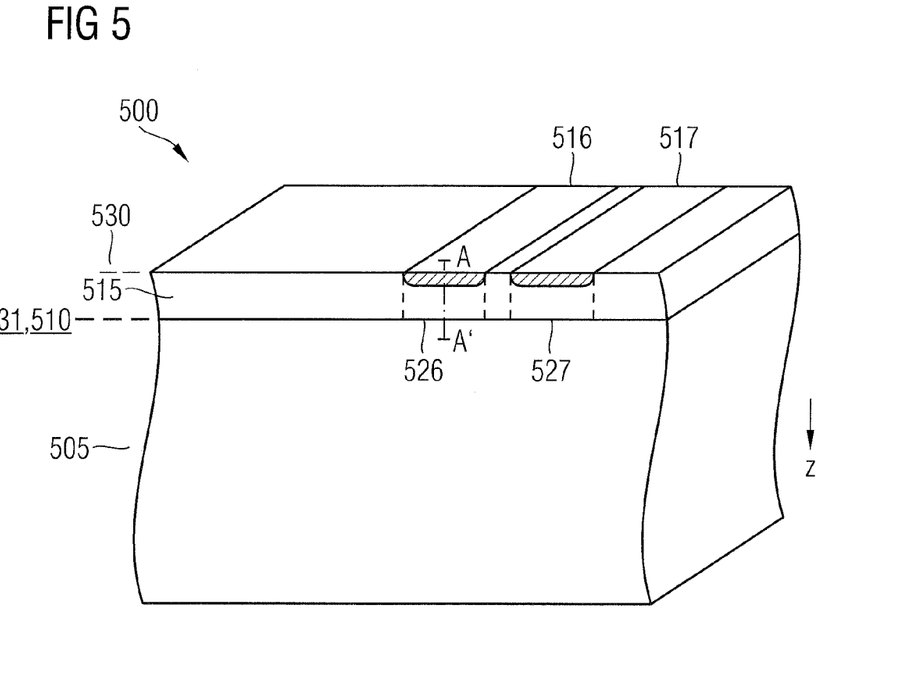
FIG. 5 illustrates a cross-sectional view of one embodiment of a semiconductor device including a silicate glass structure having silicate areas including dopants implanted at high dose and low energy.

FIG. 5 illustrates a cross-sectional view of a semiconductor device 500 according to an embodiment. The semiconductor device 500 includes a semiconductor body 505 having a first surface 510. A continuous silicate glass structure 515 is formed over the first surface 110. At least a part of the continuous glass structure 515, e.g. silicate glass areas 526 and 527 or even an overall area of the continuous glass structure 515, include a concentration of at least one of phosphor and boron that decreases by at least a factor of two or even at least a factor of 10 between a first side 530 and a second side 531 of the continuous glass structure 515, wherein the second side 531 is closer to the first surface 510 of the semiconductor body 505 than the first side 530.

The semiconductor device 500 may be any semiconductor device including IGBT, FET, e.g. Metal Oxide Semiconductor FET (MOSFET) and diode. According to one embodiment, the semiconductor device 500 is a power semiconductor device operating on similar principles to its low-power counterpart, but being able to carry a larger amount of current and typically also supporting a larger reverse-bias voltage in the off-state. As an example the semiconductor device 500 is a power semiconductor device configured to block reverse-bias voltages exceeding 30 V and/or switching currents exceeding 1 A, including e.g. reverse-bias voltages in the range of kV or 10 kV and currents in the range of kA.

In the silicate glass areas 526 and 527 of the continuous glass structure 515, the at least one of phosphor and boron that decreases by at least a factor of two or even at least a factor of 10 between the first side 530 and the second side 531 may be introduced into the silicate glass areas 526 and 527, e.g. in implant areas 526a, 527a, by a high dose and low energy implant, e.g. by an ion shower implant or by plasma deposition.

According to an embodiment, the continuous silicate glass structure 515 is a BPSG layer and the at least one of phosphor and boron that decreases by at least a factor of two between the first side 530 and the second side 531 in the silicate glass areas 526 and 527 is phosphor.

According to an embodiment, the silicate glass areas 526, 527 of the continuous glass structure 515 are located in an area surrounding an active area of the semiconductor device 500. As an example, the silicate glass areas 526, 527 may be located in an edge termination area including one or more of field ring structures, VLD edge termination structures and JTE edge termination structures. Device elements present in the active area may be absent in an area surrounding the active area. As an example, a gate electrode and/or a source and/or a body of IGBTs and FETs and anode emitter or cathode emitter of a diode may be present in the active area but absent in the area surrounding the active area.

As an example, the silicate glass structure 515 may adjoin the semiconductor body 505 in at least part of the surface 510. In other words, the silicate glass structure 515 may be in contact with the semiconductor body 505 in at least part of the surface 510. As a further example, between the first surface 510 and the silicate glass structure 515 one or plural dielectrics may be arranged, e.g. silicon oxide. The silicate glass structure 515 may includes through hole portions that may include contact structures configured to electrically couple semiconductor regions in the semiconductor body 505 and a wiring arranged above the silicate glass structure 515.

The specific embodiment illustrated in FIG. 5 includes two distinct silicate glass areas 526 and 527 including at least one of phosphor and boron that decreases by at least a factor of two between the first side 530 and the second side 531 of the continuous glass structure 515. According to another embodiment, an overall part or predominant part of the silicate glass structure 527 includes at least one of phosphor and boron that decreases by at least a factor of two between the first side 530 and the second side 531 of the continuous glass structure 515. Further, any number of distinct silicate glass areas including at least one of phosphor and boron that decreases by at least a factor of two or even at least a factor of 10 between the first side 530 and the second side 531 of the continuous glass structure 515 may be formed.

When forming the silicate glass structure 515 of BPSG and further introducing phosphor into the silicate glass structure 515 via the first side 530 in an amount that decreases by at least a factor of two or even at least a factor of 10 between the first side 530 and the second side 531 of the continuous glass structure 515, this allows to make use of a) beneficial flow characteristics of BPSG and b) beneficial gettering characteristic similar to PSG in the area including the increased amount of phosphor. As an example, introducing additional phosphor in an amount that decreases by at least a factor of two or even at least a factor of 10 between the first side 530 and the second side 531 of the continuous glass structure 515 may be carried out in an edge area of a chip and/or in an area of a wafer corresponding to a wafer dicing track. Further, by introducing phosphor and/or boron into the silicate glass layer 515 via masked implantation, the flow characteristic of the silicate glass layer 515 may be improved in areas that are sensitive to positive or negative charges or have a critical or pronounced topology. As an example, implanted areas in the range several $10\,\mu m^2$ to several $100\,\mu m^2$ may be provided in areas which are sensitive to positive or negative charges or have a critical or pronounced topology. These implanted areas may be arranged in a pattern of islands, for example. Some or all of the islands may be separate from each other, may overlap, may differ in size and/or shape.

Figure 6:
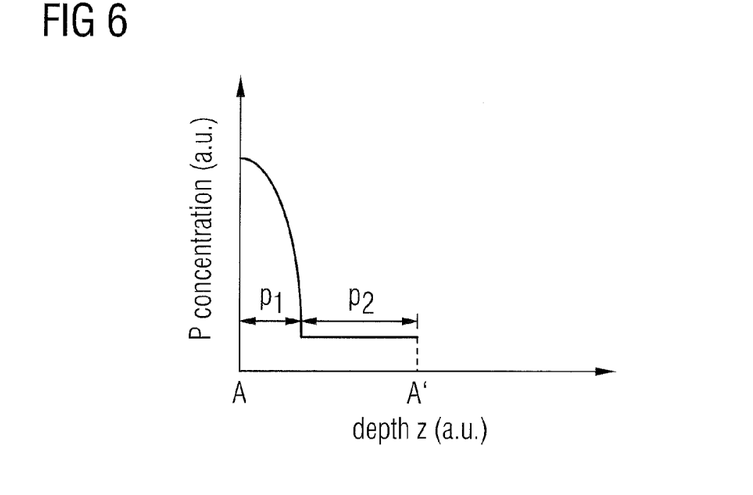
FIG. 6 illustrates one example of a profile of implanted phosphor along a line AA' illustrated in FIG. 5.

FIG. 6 illustrates one example of profile of phosphor along a line A-A' through the silicate glass area illustrated in FIG. 5. The profile of phosphor decreases along a depth z from the first side 530 of the continuous glass structure 515 illustrated in FIG. 5 to the second side 531 illustrated in FIG. 5. In a part $p_1$ the profile corresponds to an implant profile after thermal anneal/drive-in whereas a second part $p_2$ includes a constant or almost constant amount of phosphor present in a BPSG layer. Apart from the specific profile of phosphor illustrated in FIG. 6, a vast variety of different profiles may be formed provided that the concentration of phosphor decreases by at least a factor of two between the first side 530 and the second side 531. As an example, implanted phosphor may reach the second side 531 by diffusion. As an example, a dose of the implanted phosphor is in a range between $5\times10^{16}$ cm$^{-2}$ and $5\times10^{17}$ cm$^{-2}$. Implant voltages may be in a range of 0.1 kV to 30 kV, or in a range of 0.5 kV to 20 kV, for example.

Figure 7:
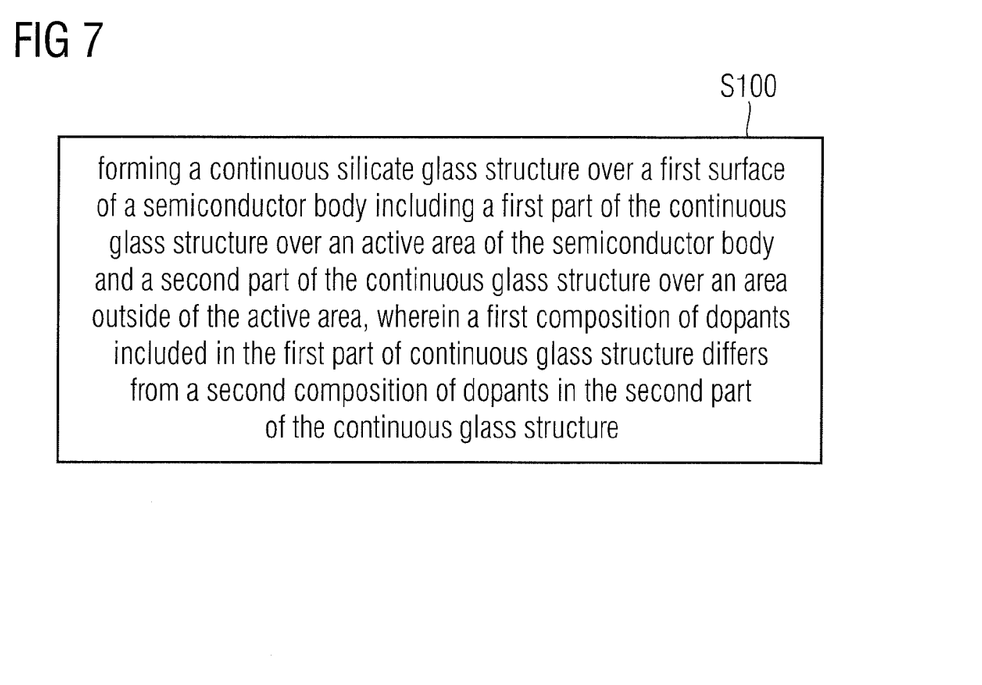
FIG. 7 illustrates one embodiment of a process flow of manufacturing a semiconductor device including a silicate glass structure having different compositions of dopants in a first area and in a second area.

FIG. 7 illustrates one embodiment of a process flow of manufacturing a semiconductor device. Process feature S100 includes forming a continuous silicate glass structure over a first surface of a semiconductor body including a first part of the continuous glass structure over an active area of the semiconductor body and a second part of the continuous glass structure over an area outside of the active area, wherein a first composition of dopants included in the first part of continuous glass structure differs from a second composition of dopants of the second part of the continuous glass structure.

According to one embodiment, the process flow further includes forming a first silicate glass layer of the continuous silicate glass structure over the active area and the area outside of the active area, removing at least a part of the first silicate glass layer over the area outside of the active area and forming a second silicate glass layer of the continuous silicate glass structure over the active area and the area outside of the active area. According to one embodiment, the first silicate glass layer includes BPSG and the second silicate glass layer includes at least one of PSG and BSG.

According to another embodiment, the process flow further includes forming a first silicate glass layer of the continuous silicate glass structure over the active area and the area outside of the active area, removing the first silicate glass layer over the active area, and forming a second silicate glass layer of the continuous silicate glass structure over the active area and the area outside of the active area. According to one embodiment, the first silicate glass layer includes at least one of PSG and BSG and the second silicate glass layer includes BPSG.

According to yet another embodiment, the process flow further includes forming a first silicate glass layer of the continuous silicate glass structure over the active area and the area outside of the active area, removing the first silicate glass layer over the active area, forming a second silicate glass layer of the continuous silicate glass structure over the active area and the area outside of the active area, and removing the second silicate glass layer over the area outside of the active area.

Figure 8:
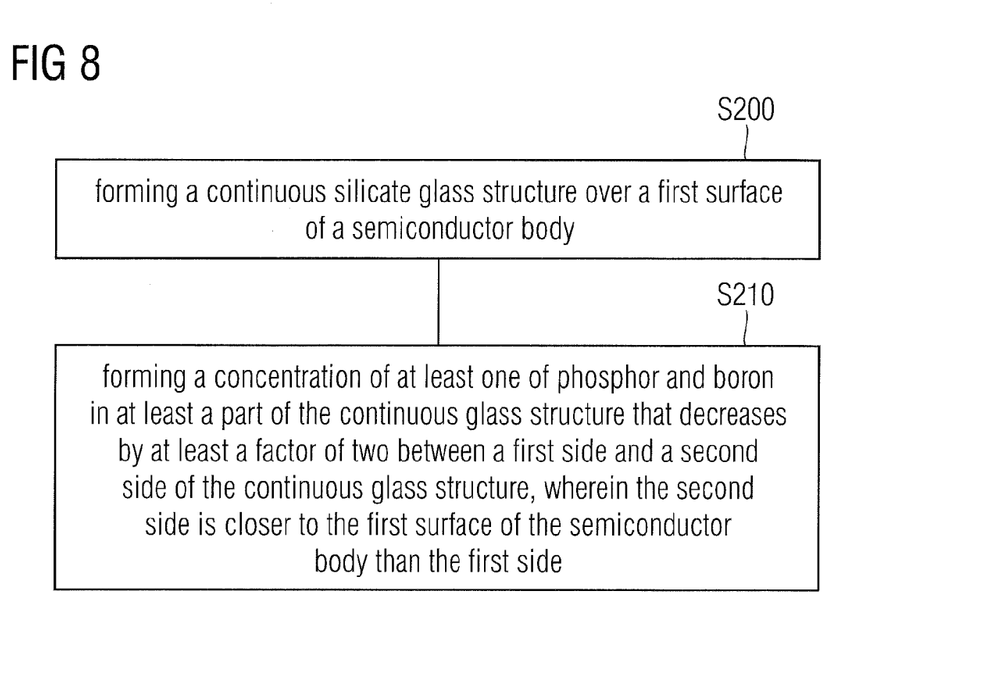
FIG. 8 illustrates one embodiment of a process flow of manufacturing a semiconductor device including a silicate glass structure having silicate areas including dopants implanted at high dose and low energy.

FIG. 8 illustrates one embodiment of a process flow of manufacturing a semiconductor device. Process feature S200 includes forming a continuous silicate glass structure over a first surface of a semiconductor body. Process feature S210 includes forming, in at least a part of the continuous glass structure, includes a concentration of at least one of phosphor and boron that decreases by at least a factor of two between a first side and a second side of the continuous glass structure, wherein the second side is closer to the first surface of the semiconductor body than the first side.

According to one embodiment, the continuous silicate glass structure is formed as BPSG and phosphor is implanted in at least a part of the continuous glass structure with high dose at low energy, wherein a profile of the implanted boron decreases by at least a factor of two between a first side and a second side of the continuous glass structure.

According to another embodiment, the continuous silicate glass structure is formed as an undoped silicate glass (USG) and boron is implanted in at least a part of the continuous glass structure with high dose at low energy, wherein a profile of the implanted boron decreases by at least a factor of two between a first side and a second side of the continuous glass structure. A third undoped silicate glass layer can be optionally deposited between the semiconductor and the BPSG layer and another undoped silicate glass layer can be optionally deposited on the phosphorous doped BPSG layer.

According to another embodiment, the continuous silicate glass structure is formed as a stack of BSG and USG and boron is implanted in at least a part of the USG with high dose at low energy, wherein a profile of the implanted boron decreases by at least a factor of two between a first side and a second side of the continuous glass structure.

According to yet another embodiment, the continuous silicate glass structure is formed as an USG and boron and phosphor are implanted subsequently in arbitrary sequence in same or different parts of the continuous glass structure with high dose at low energy, wherein a profile of each one of the implanted boron and phosphor decreases by at least a factor of two between a first side and a second side of the continuous glass structure. Optionally, an annealing step can be performed between the individual implantation steps and/or after all implantation steps.

As an example, a dose of the at least one of phosphor and boron is in a range between $5\times10^{16}$ cm$^{-2}$ and $5\times10^{17}$ cm$^{-2}$. Implant voltages may be in a range of 0.1 kV to 30 kV, or in a range of 0.5 kV to 20 kV, for example. High dose and low energy implants may also be applied when doping polysilicon material in a trench.

Figure 9A:
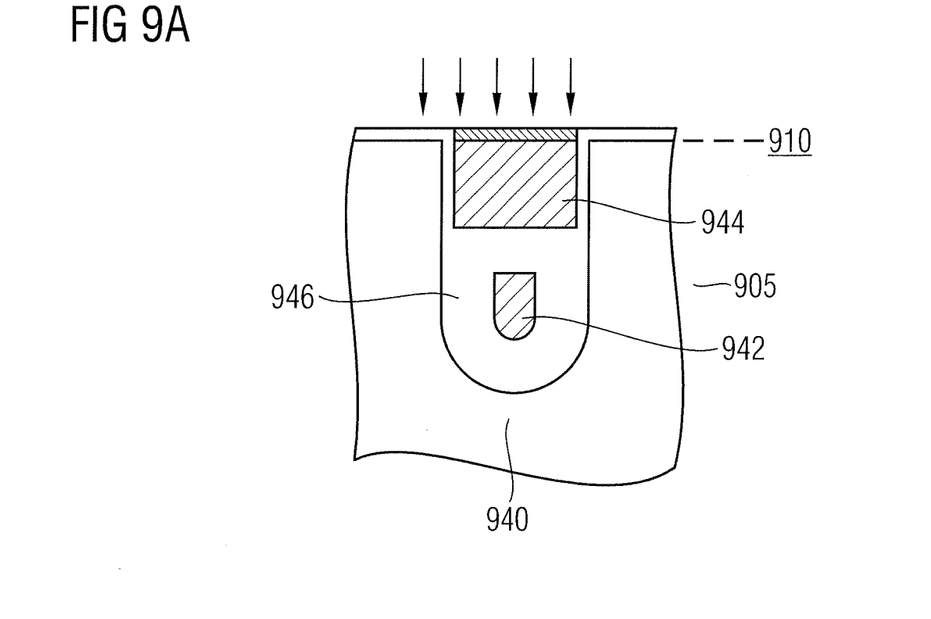
FIGS. 9A to 9D illustrate schematic cross sectional views of a semiconductor body undergoing high dose and low energy implants into a polysilicon layer in a trench.

FIG. 9A illustrates a cross sectional view of a semiconductor body 905 during manufacture of a semiconductor device, e.g. a FET or IGBT. The processing stage illustrated in FIG. 9A starts with the semiconductor body 905 including a trench 940 at a first surface 910. The trench 940 includes an optional field electrode 942 and a polysilicon gate electrode 944. The optional field electrode 942 and the gate electrode 944 are surrounded by a dielectric structure 946 acting as a gate dielectric between the gate electrode 944 and the semiconductor body 905. The polysilicon gate electrode 944 may be undoped or lightly doped.

Boron is implanted at high dose and low energy into a part 949 of the polysilicon gate electrode 944 at the first surface 910. As an example, a dose of the at least one of phosphor and boron is in a range between $5 \times 10^{16}$ cm$^{-2}$ and $5 \times 10^{17}$ cm$^{-2}$. Implant voltages may be in a range of 0.1 kV to 30 kV, or in a range of 0.5 kV to 20 kV, for example.

Figure 9B:
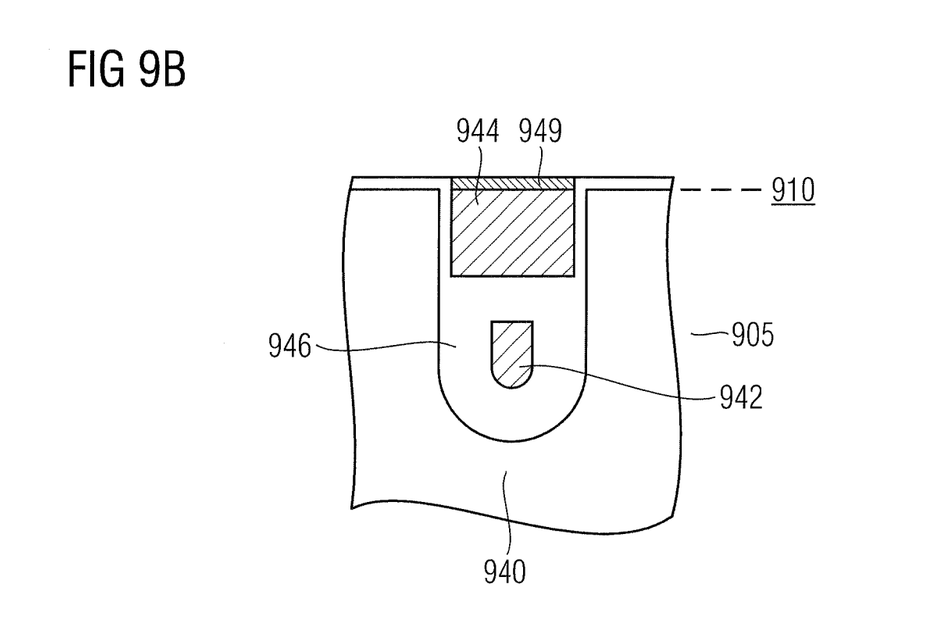

As is illustrated in the cross sectional view of FIG. 9B, a thermal treatment leads to drive-in of the implanted boron into a depth of the polysilicon gate electrode 944 leading to a low or medium p-doping in a bottom and medium part of the polysilicon gate electrode 944 while a p$^+$-doping remains in a top part of the polysilicon gate electrode 944 at the first surface 910. This allows for a reduced path resistance of the polysilicon gate electrode 944 due to the p$^+$-doping in the top part while counteracting diffusion of boron through the gate oxide due to the low or medium p-doping in the medium part of the polysilicon gate where the gate oxide is located.

Figure 9C:
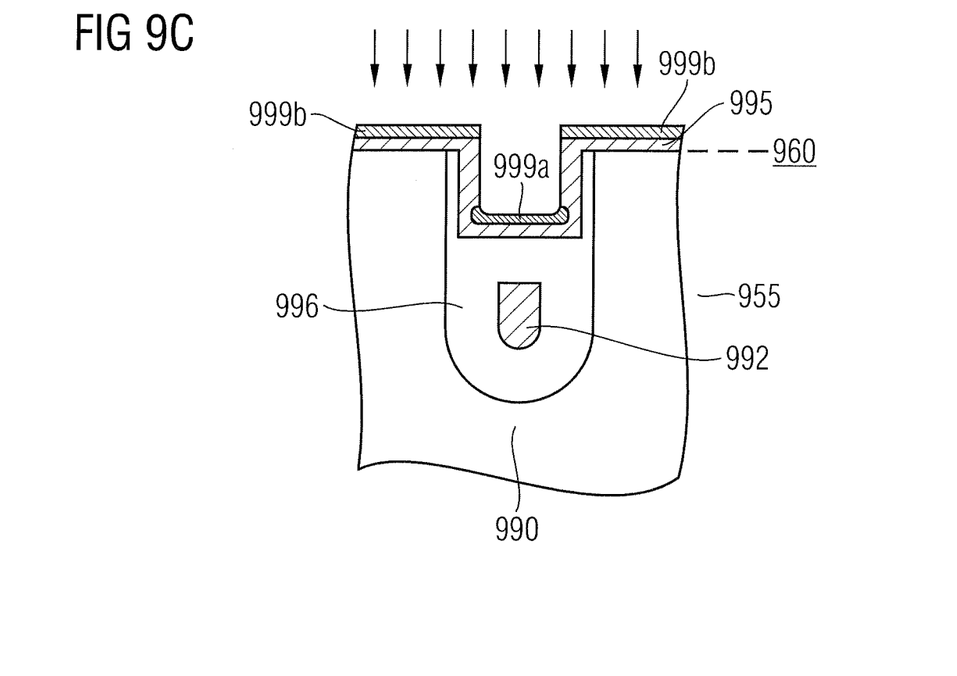

FIG. 9C illustrates a cross sectional view of a semiconductor body 955 during manufacture of a semiconductor device, e.g. a FET or IGBT. The processing stage illustrated in FIG. 9C starts with the semiconductor body 955 including a trench 990 at a first surface 960. The trench 990 includes an optional field electrode 992 and a conformal polysilicon layer 995. The optional field electrode 992 is surrounded by a dielectric structure 996 and the conformal polysilicon layer 995 is adjoining the dielectric structure 996. The conformal polysilicon layer 995 may be undoped or lightly doped.

Boron is implanted at high dose and low energy into a surface of the conformal polysilicon layer 995 in a bottom part 999a of the trench 990 as well into a surface part 999b of the conformal polysilicon layer 995 on the first surface 960. As an example, a dose of the at least one of phosphor and boron is in a range between $5 \times 10^{16}$ cm$^{-2}$ and $5 \times 10^{17}$ cm$^{-2}$. Implant voltages may be in a range of 0.1 kV to 30 kV, or in a range of 0.5 kV to 20 kV, for example.

Figure 9D:
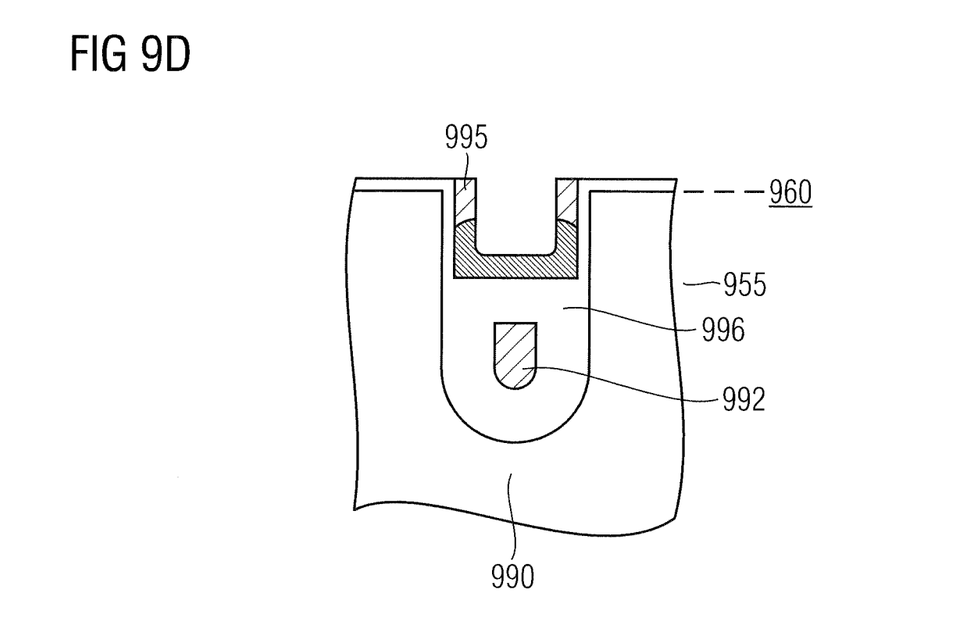

As is illustrated in the cross sectional view of FIG. 9D, the conformal polysilicon layer 995 is removed on the first surface 960, e.g. by an appropriate process such as etching or chemical mechanical polishing (CMP). A thermal treatment leads to drive-in of the implanted boron from the bottom part 999a of the conformal polysilicon layer 995 leading to a low or medium p-doping in a top part of the conformal polysilicon layer 995 in the trench 990 while a p$^+$-doping remains in a bottom part of the conformal polysilicon layer 995. Thereby, variable path resistances may be realized along an extension of a trench, e.g. a trench stripe allowing to damp fast cycles of operation that may tend to resonant oscillations. According to other embodiments, subsequent high dose and low energy implants of phosphor and boron into polysilicon material in a trench allows to manufacture Zener diodes, diodes, npn or pnp structures that may be used in temperature sensors, for example. As an example, a high concentration of dopants buried at a bottom side of polysilicon in a trench may be formed.

In the embodiments illustrated in FIGS. 9A to 9D boron is implanted into the polysilicon gate electrode at high dose and low energy. According to other examples, phosphor may be likewise implanted into the polysilicon gate electrode at high dose and low energy.

Terms such as "first", "second", and the like, are used to describe various structures, elements, regions, sections, etc. and are not intended to be limiting. Like terms refer to like elements throughout the description.

The terms "having", "containing", "including", "comprising" and the like are open and the terms indicate the presence of stated elements or features, but not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor body including a first surface;
   a continuous silicate glass structure over the first surface; and wherein
   a part of the continuous glass structure in an area at least partially surrounding the active area includes a concentration of at least one of phosphor and boron that decreases by at least a factor of two between a first side and a second side of the continuous glass structure, wherein the second side is closer to the first surface of the semiconductor body than the first side.

2. The semiconductor device of claim 1, wherein an implantation dose of the at least one of phosphor and boron is in a range between $5 \times 10^{16}$ cm$^{-2}$ and $5 \times 10^{17}$ cm$^{-2}$.

3. The semiconductor device of claim 1, wherein the part of the continuous glass structure excludes an active area and includes an area at least partially surrounding the active area.

4. The semiconductor device of claim 1, wherein the part of the continuous glass structure includes an overall area of the continuous glass structure.

5. The semiconductor device of claim 1, wherein the continuous glass structure includes an undoped silicate glass layer on top and/or at the bottom.

6. The semiconductor device of claim 1, wherein the semiconductor device is one of an insulated gate bipolar transistor, diode, silicon controlled rectifier, and metal-oxide-semiconductor field-effect transistor.

7. A semiconductor device, comprising:
   a semiconductor body including a first surface;
   a continuous silicate glass layer stack over the first surface; and wherein
   the continuous silicate glass layer stack includes at least one BPSG layer and one PSG layer over an active area of the semiconductor body and over a junction termination area surrounding the active area.

8. The semiconductor device of claim 7, wherein the continuous silicate glass layer stack further includes at least one of BSG and USG.

* * * * *